United States Patent [19]

Kane et al.

[11] Patent Number: 4,614,837

[45] Date of Patent: Sep. 30, 1986

[54] METHOD FOR PLACING ELECTRICALLY CONDUCTIVE PATHS ON A SUBSTRATE

[75] Inventors: Robert P. Kane, Camillus; Edwin D. Lillie, Syracuse; John D. Neidig, Clay, all of N.Y.

[73] Assignee: Allied Corporation, Morris Township, Morris County, N.J.

[21] Appl. No.: 719,789

[22] Filed: Apr. 3, 1985

[51] Int. Cl.⁴ .............................................. H05K 1/00
[52] U.S. Cl. ..................................... 174/68.5; 29/846;
29/851; 361/401; 361/402; 427/71; 427/96;
427/123; 428/901; 419/8; 419/10; 419/23;
419/24; 419/48; 419/66
[58] Field of Search .................. 428/901; 29/846, 851;
174/68.5; 361/401, 402; 427/71, 96, 123; 419/8,
10, 23, 24, 48, 66

[56] References Cited

U.S. PATENT DOCUMENTS

| | | | |
|---|---|---|---|
| 3,800,020 | 3/1974 | Parfet | 419/48 |
| 4,394,709 | 7/1983 | Brower et al. | 361/401 |
| 4,394,710 | 7/1983 | Brower et al. | 361/401 |
| 4,510,174 | 4/1985 | Holzapfel et al. | 427/71 |

*Primary Examiner*—Stephen J. Lechert, Jr.
*Attorney, Agent, or Firm*—Richard C. Stewart; Gerhard H. Fuchs

[57] ABSTRACT

A process for placing conductive paths on to the surface of a heat softenable substrate by applying a layer of metal powder to the substrate, compacting the powder in a pre-determined pattern by applying a heated die under pressure, and embedding the compacted powder by the continued application of the die at a pressure less than the compacting pressure.

36 Claims, 4 Drawing Figures

METHOD FOR PLACING ELECTRICALLY CONDUCTIVE PATHS ON A SUBSTRATE

BACKGROUND OF THE INVENTION

1. Field of the Invention

This invention relates to a process for placing electrically conductive paths on a substrate. The process of this invention is particularly useful for the manufacture of printed circuit boards.

2. Prior Art

Electrical instrumentation utilizes circuit boards for connecting together the components of its circuitry. Each circuit board is comprised of a dielectric substrate having on the surface a plurality of electrically conductive paths, arranged in a pre-determined manner, to connect together circuit elements mounted on the substrate. A number of procedures have been developed for manufacturing printed circuit boards. For example, in one method, the conductive paths may be placed on the substrate by the application of a metal conductor to the substrate and the subsequent removal of portions of the conductor by liquid chemicals or by depositing an electrical conductor on the substrate with chemical plating baths. Examples of other methods of manufacturing circuit boards may be found in U.S. Pat. Nos. 4,327,124 and 3,013,913. In these methods which involve the use of chemicals a number of problems exist. For example, chemical wastes are a problem as the wastes must be disposed of without adversely affecting the environment. Moreover, chemicals for use in these methods are relatively expensive, and these methods are complex such that only a few companies are capable of producing printed circuit boards using these methods.

Various attempts have been made to manufacture printed circuit boards through use of powdered metallurgical techniques. For example, U.S. Pat. No. 2,993,815 teaches the application of a copper and glass containing paste to a refractory substrate in the desired pattern, followed by a heat treatment to sinter the metal and cause it to bond to the substrate. Another powdered metallurgical procedure is described in U.S. Pat. No. 3,256,109 in which a metallic compound is initially atomized with the material making up the substrate, with the circuit pattern formed by thermal decomposition induced by a heated die. Yet another powdered metallurgical approach is disclosed in U.S. Pat. No. 3,410,714, in which a circuit forming material, such as powdered copper, is applied to a substrate in the desired pattern, whereupon the structure is heated at a relatively high temperature to cause alloying and bonding of the metal to the substrate. Still another powdered metallurgical method of manufacturing printed circuit boards is disclosed in U.S. Pat. No. 3,800,020. In this procedure, a printed circuit board is formed by applying a thin layer of powdered metal composed of a mixture of copper-tin-lead to a heat softenable substrate, followed by application of a heated die having the desired circuit pattern thereon to sinter the metal particles in the areas contacted with the circuit defining portions of the die and to soften the substrate to effect a bond between the sintered metal circuit pattern and the substrate. Each of these powdered metallurgical methods suffer from a number of inherent disadvantages. For example, in some of these procedures, the resulting metal printed circuit contains dispersed materials from the substrate, resulting in a circuit that does not have the conductivity necessary for certain circuit board applications. Other of these methods are complicated and expensive, and do not readily lend themselves to mass production techniques.

SUMMARY OF THE INVENTION

This invention relates to a method of placing an electrically conductive path on a substrate, which path comprises a compacted finely divided metal embedded in said substrate. This method is particularly suited for the manufacture of printed circuit boards. More particularly, the method of this invention comprises the steps of:

(a) applying a layer of a composition comprising a finely divided metal powder to all or a portion of a surface of a heat softenable substrate;

(b) compacting said metal powder in a pre-determined circuit pattern by applying a heated die to said metal powder at a pressure and for a time sufficient to compact said powder, said die having the desired circuit pattern thereon and projecting from the surface thereof and acting to compact the metal particles in the areas contacted by the circuit defining portions of said die; and (c) embedding said compacted metal powder into said surface of said substrate by continuing the application of said heated die to said compacted metal powder at a pressure and for a time sufficient to embed said compacted powder in said substrate.

Another aspect of this invention relates to a printed circuit board prepared in accordance with the process of this invention.

The invention permits the use of readily available and relatively inexpensive heat softenable substrates such as thermoplastic resins. Another advantage of the invention is that it is a simple dry method of placing conductive paths on a substrate, and as a result the use of large quantities of potentially hazardous liquid chemicals is not required. Yet another advantage of the invention is that it reduces the complexity and expense of manufacturing circuit boards, and readily lends itself to essentially continuous production of boards. Other advantages of this invention will be apparent to those of skill in the art from the following specification.

DESCRIPTION OF THE PREFERRED EMBODIMENTS

Figure 1:
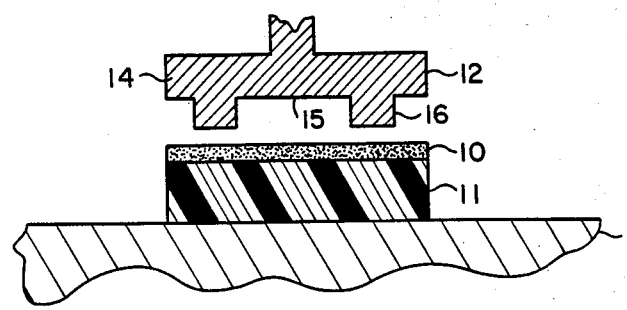
FIGS. 1 to 4 illustrate the steps of a preferred embodiment of the process of this invention.

Referring to FIG. 1, a layer 10 of finely divided metal is applied on the upper planar surface of a heat deformable substrate 11. In the preferred embodiments of this invention, the thickness of layer 10 is substantially uniform. The type of metal used in the construction of layer 10 is critical and are those having melting points equal to or greater than the temperature used in the compaction and embedding step, and this does not include tin/lead solders which have melting points below this temperature. Generally, such metals will be those normally used or capable of use in electrical devices for forming conductive circuits. Illustrative of useful metals are copper, nickel, tin, palladium, platinum, iron, silver, aluminum, gold and the like, and alloys thereof, such as nickel/tin, copper/tin, nickel/palladium and the like. In the preferred embodiments, metals used are in the form of flaky particles which are preferably irregular in shape, as for example those which are formed by depositing the metal on a flexible substrate from an electrolyte plating bath. Copper, and metals having melting points above those employed in the compaction and embedding steps, e.g., greater than about 400° C., are preferred metals for use in the formation of layer 10, and copper is most preferred. In the preferred embodiments of the invention, the finely divided metal is treated to remove all or a portion of any oxide layer. This treatment step can be carried out prior to application of the finely divided metal to substrate 11 or after compaction and embedding of the compacted finely divided metal into substrate 11. In the particularly preferred embodiments of the invention, all or substantially all oxide coatings are removed. Useful procedures for removing oxide layers which may coat a metal are well known in the art. For example, a method suitable for use with copper is hydrogen reduction.

The metal used in the formation of layer 10 is in the form of finely divided particles. The shape of the particles can vary widely, however in the preferred embodiments of the invention, the particles are flaky and irregular in shape. Such flaky particles can be conveniently prepared by electrolytic deposition from a plating bath onto a flexible substrate, as for example, a rotating or moving drum or belt, and thereafter flexing said substrate, loosening the deposited metal in flakes, called electrolytic dust. Such procedures for forming such flaky metal particles are well known in the art and will not be discribed herein in great detail.

Similarly, particle size can also vary widely. In the preferred embodiments of the invention, the metal particles are in the form of finely divided, flaky, irregularly shaped particles having an average diameter of not more than about 75 micrometers, and in the particularly preferred embodiments, such particles are in the form of finely divided, flaky, irregularly shaped particles having an average diameter of less than about 50 micrometers. Amongst these particularly preferred embodiments, most preferred are those embodiments in which metal particles are in the form of finely divided, flaky, irregularly shaped particles in which the average particle diameter is less than about 35 micrometers.

The metal particles can be applied over all of the surface of substrate 11, or over a portion thereof. Any suitable technique useful for applying metal particles to the surface of a planar substrate can be used. Illustrative of useful techniques are screening, spreading with doctor blade, spraying, depositing by electrostatic deposition, and the like. Such techniques of applying metal particles to a substrate are well known in the art and will not be described herein in great detail. The metal particles can be applied in a single application or multiple applications can be made depending on the desired thickness of layer 10 and of conductive circuit pattern 18 in the finished product. The amount of the metal particles applied to the heat softenable substrate is not critical and will vary widely depending on a number of factors known to those of skill in the art, such as the desired thickness of the conductive circuits and whether single or multiple applications are intended and the like. In the preferred embodiments, the amount of the metal particles applied is sufficient to provide a layer 10 which covers all of the surface of substrate 11.

The substrate 11 is composed of a "heat softenable material". As used herein a "heat softenable material" is a naturally occurring or synthetic polymeric or elastomeric material which softens on application of heat and hardens on removal of the heat, and which is not materially affected by the softening and hardening process. The material from which substrate 11 is formed does not constitute a limitation on the invention. The substrate 11 may be formed from a sheet, either plain or reinforced, or molded materials. Useful materials can be filled or unfilled. In the preferred embodiments of the invention, thermoplastic polymeric materials are used. Illustrative of materials which can be used in the construction of substrate 11 are polymers of $\alpha,\beta$-unsaturated olefins such as polyethylene, polyvinyl chloride, polyvinyl alcohol, polyacrylates, polypropylene, polymethacrylates, polyvinyl chloride, and the like; polyethers; polyesters such as polyethylene terephthalate, polybutylene terephthalate and the like; polyamides such as nylon-11, nylon-12, nylon-6, nylon-66 and the like; polysulfones; polyphenylene oxides; polyetherimides; polyethersulfones; polyphenylenesulfides; polyamideimides and the like. Polyetherimides, polyethylene terephthalate, polysulfones, polyethersulfones and polyphenylene sulfides are particularly preferred, and polyetherimides are most preferred. The substrate may be plain or laminated, the essential consideration being that the surface of the substrate on which the circuit is impressed will soften sufficiently to permit the compacted metal particle circuit to be firmly bonded to the substrate in the third step of the process of this invention. Useful heat softenable materials also include prepregs for use in the formation of semi-interpenetrating network type systems, usually comprising a crosslinkable polymeric system such as cyanurate polymer, and other thermosetting polymers such as an epoxy resin, containing fibers of other materials such as boron, carbon, glass fibers, polyaramid fibers and thermoplastic polymer fibers, such as polyethersulfones and polyester carbonates. At some subsequent point in the process, preferably after compacting and embedding as described below, these prepregs are then heat treated to crosslink or thermoset the thermosetting polymer.

Figure 2:
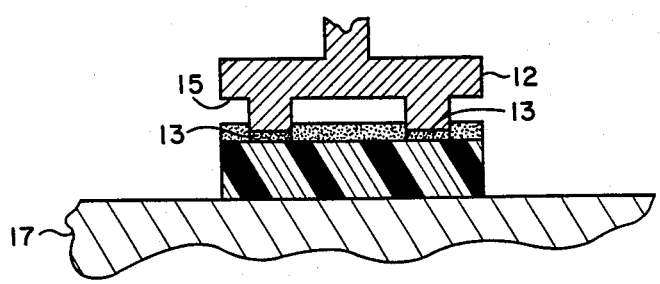
Figure 3:
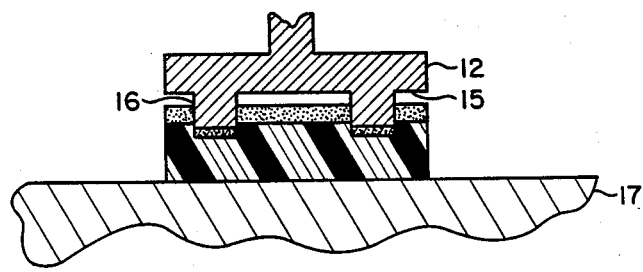

The second step of the process of this invention is illustrated in FIGS. 1 and 2. In step 2, the metal particles are compacted and sintered in a pre-determined circuit pattern by application of a heated die 12 having some heating element (not shown) to said metal powder at a pressure and for a time sufficient to form a pattern of compacted metal particles 13 on the surface of the substrate 11. In the embodiment depicted in the drawings, die 12 for forming circuit pattern 13 comprises a metallic base 14 having a surface 15 from which projections 16 configured to define the desired circuit pattern prevent. Projections 16 may be formed by machining or, depending upon the configuration of the circuit pattern, they may be formed from wire configured into the desired circuit pattern and brazed or otherwise secured to the surface 15 of die 12. Projections 16 can also be formed by chemical milling or etching. The shape of projections 16 may vary widely. In the preferred embodiments of the invention, projections 16 have a rectangular or square cross-section. In the preferred embodiments of this invention, the surface of projections 16 which contact the metal particles is concave or curved inward. The size or other configuration of die 12 does not constitute a limitation on the invention and a single die may be utilized to form a multiplicity of repetitive or non-repetitive circuit patterns which will be impressed upon a substrate which is then cut to form as many circuit boards as there are repetitive patterns. Die 12 may be flat or may be of curved configuration for use in a rotary or rocker dieing operation, but is generally flat in the preferred embodiments.

Die 12 is used to apply pressure between substrate 11 and metal particles 10 at a temperature and for a time to obtain a "compacted powder" on the surface of substrate 11 as shown in FIG. 2 positioned on a platen 17. In the preferred embodiments of the invention, platen 17 has a cooling element (not depicted) which preferably maintains the temperature of platen 17 below about 40° C., more preferably below about 30° C., during the compaction and embedding steps described below. As used herein, a "compacted powder" is the conductive circuit that forms as a result of applying pressure and heat to the metal powder. In any particular situation, there is a relationship between the amount of pressure employed, the temperature of die 12 and the time during which the die 12 is applied to the metal particles. In general, the higher the application pressure and temperature, the shorter the application time required to obtain a compacted powder; and conversly the lower the application temperature and pressure the longer the application time required to form a compacted powder. The pressure applied may vary widely depending on the substrate and material chosen for the construction of metal particle layer 10 and the substrate 11 and the application temperature and times chosen for use. In general, the amount of pressure applied and the duration of the pressure application step will depend on the "deformability" of the metal particles. As used herein "deformability" is the ability of the particles to form together as a dense compact having relatively low porosity. The greater the deformability of the metal particles, the less pressure need be applied to compact the powder, and conversely, the less the deformability of the powder the greater the compacting pressure and the greater the time required to compact the powder to a given extent. Usually, the application temperature at a given pressure and given application time is between about the isothermal annealing temperature of the metal and less than about its melting point. Usually, the pressure applied is not more than the highest pressure possible that can be applied to the metal particles in layer 10 without adversely affecting the substrate or substantially embedding the compacted powder in the substrate at a given temperature for a given period of time. Such adverse effects include fracturing of substrate 11, or bending or warping of substrate 11 so that it is not acceptable for use as a circuit board. In general, the application pressure will vary from about 34,470 kPa to about 379,170 kPa at a temperature of from about 25° C. to about 300° C. for a period of from about 1 to about 3600 secs. In the preferred embodiments of the invention, application pressures will vary from about 68,940 kPa to about 275,760 kPa at a temperature of from about 100° C. to about 280° C., for a period of from about 1 sec to about 60 secs; and in the particularly preferred embodiments will vary from about 22,728 kPa to about 241,290 kPa at a temperature from about 180° C. to about 300° C. for a period of from about 1 to about 30 secs. In the most preferred embodiments of the invention where polyetherimide is the substrate and copper electrolytic dust is the metal powder, the pressure used is from about 103,410 kPa to about 241,290 kPa at a temperature of from 240° C. to 265° C., for a period of from about 1 to about 15 secs. In the most preferred embodiment of the invention where the metal powder is tin or a copper/tin alloy the pressure used is from about 103,410 kPa to about 172,350 kPa at a temperature of from about 170° C. to about 250° C. for a period of from about 1 to about 20 secs. Such pressure and heat treatment step is sufficient to increase the bulk density, and conductivity of the metal powder such that it is suitable for use as a conductive circuit.

Thickness of conductive circuit layer 18 can vary widely and is usually of a thickness normally used for electrical circuits. In the preferred embodiments, layer 18 has an average thickness of at least about 0.005 mm. In the preferred embodiments of the invention, the average thickness of layer 18 is from about 0.005 to about 0.30 mm, and in the particularly preferred embodiments is from about 0.05 to about 0.10 mm. Amongst these particularly preferred embodiments, most preferred are those embodiments in which the average thickness of layer 18 is from about 0.05 to about 0.10 mm. The desired thickness of layer 18 can be achieved in a single application and compaction, or multiple applications and/or compactions can be employed. Layer 18 preferably has a conductivity of at least about 5% IACS. In the particularly preferred embodiments, layer 18 has a conductivity of at least about 20% IACS, and in the most preferred embodiments, has a conductivity of at least 30% IACS. The % IACS is well known in the art and is equal to the ratio of the conductivity of layer 18 to the conductivity of pure copper multiplied times one hundred.

Figure 4:
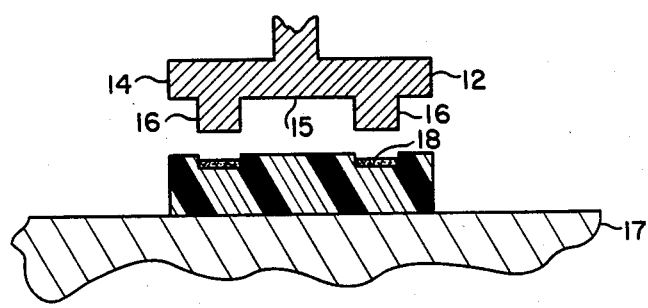

The third step of the process of this invention is depicted in FIG. 4. In this step, the compacted conductive layer 18 is embedded into the surface of substrate 11, by applying pressure to the compacted powder with the heated die. In the preferred embodiments, the pressure employed in the embedding step 3 is less than that used in the compaction step 2. Here again, embedding pressure, and temperatures, and application times can vary widely and will depend on the softness of the heat softenable substrate and the melting point of the compacted metal powder, which processes are interrelated. That is, the higher the embedding pressure and temperature, the shorter the application time; and the lower the embedding pressure and temperature, the longer the application time. In general, embedding pressures, and temperatures, and application times are employed to embed the circuit below the surface of the substrate without adversely affecting the compacted circuit or substrate.

In step 3, the above results can be achieved where the temperature of die 12 is from about 25° C. to about 300° C., embedding times are from about 1 second to about 3600 seconds, and embedding the pressures exerted by die 12 on layer 18 are from about 689.4 kPa to about 344,700 kPa. In the preferred embodiments of the invention, the temperature of die 12 will vary from about 180° C. to about 280° C., and the die 12 will be maintained in contact with compacted layer 18 for from about 1 to about 60 seconds at a pressure of from about 34,470 kPa to about 68,940 kPa and in the particularly preferred embodiments, application temperatures will vary from about 200° C. to about 265° C. application pressures will vary from about 6,894 kPa to about 34,470 kPa, and application times will vary from about 1 to about 30 seconds. Amongst these particularly preferred embodiments, most preferred are those embodiments in which application temperatures are from about 245° C. to about 260° C., application pressures are from about 10,341 kPa to about 24,129 kPa; and application times are from about 5 secs to about 20 secs.

The extent to which the compacted metal powder is embedded in substrate 11 can vary widely. In the preferred embodiments, the compacted powder is embedded to a depth of at least 75 micrometers, and in the particularly preferred embodiments is embedded to a depth of from about 75 to about 250 micrometers. Amongst these particularly preferred embodiments, most preferred are those embodiments in which the compacted powder is embedded in said substrate to a depth of from about 125 to about 200 micrometers.

In the embodiment illustrated in the drawing, the compaction and the embedding are illustrated in two distinct steps. However, it should be appreciated that both compaction and embedding can be carried out in a single step, and that compaction can continue as the partially compacted metal is embedded in substrate 11.

In one preferred embodiment of this invention, steps 2 and 3 are carried out as follows. Die 12 is heated to a temperature of from about 180° C. to about 300° C., more preferably about 200° C. to about 280° C., and is applied to layer 10 at a pressure of between about 82,728 kPa to about 275,760 kPa, more preferably about 103,410 kPa to about 241,290 kPa, and maintained thereabout from about 1 to about 30 secs., more preferably from about 1 to about 10 secs. The pressure is thereafter reduced over a period of from about 1 to about 20 secs to a value in the range of from about 3,447 kPa to about 68,940 kPa, more preferably from about 6,894 kPa to about 34,470 kPa, and maintained at that pressure for a period of from about 1 to about 60 secs, more preferably from about 1 to about 30 secs.

In the preferred embodiments of the invention, the substrate 11 is coated during the compaction and embedding steps. Normally, such coating is carried out by placing the substrate 11 on a coated horizontal structure, e.g., temperature equal to or less than about 30° C., preferably equal to or less than about 25° C.

Since only those areas of the powdered layer 10 contacted by projections 16 of die 12 will be embedded and bonded to substrate 11, the remainder of the powdered metal may be reclaimed following removal of die 12. For example, the remainder of powdered layer 10 can be shaken from substrate 11 into a suitable container and recycled. Alternatively, a vacuum system may be employed to remove uncompacted powder layer 10 either alone or in conjunction with the vibrator mechanism, and vacuum means also may be employed to return the uncompacted powdered metal to a site for reuse.

Thereafter, the substrates are collected for such additional processing steps as may be required, inclusive of cutting a substrate containing a plurality of repetitive patterns into individual units and such further finishing steps as may be required.

As should now be evident, the instant invention provides a simple, efficient and inexpensive procedure for forming printed circuit boards which is essentially waste-free. The resultant circuit boards have a unique sinter-bonded circuit pattern formed from an alloy having excellent dielectric properties, yet the sintering operation is conducted at relatively low temperatures.

The following specific examples are presented to illustrate the invention in detail and are not to be construed as a limitation thereon.

EXAMPLES 1 To 45

General Procedure

A. Materials Preparation:

1. Cleaning the Copper Electrolytic Dust

The copper electrolytic dust obtained from Fisher Scientific, catalog Item #C-434, is used in the preparation of the circuts. The material as received has a heavy oxide coating. Hydrogen reduction is used to remove these oxides. In this procedure, approximately 25 g of the copper dust is charged into an externally heated batch reactor. The reactor is charged with nitrogen and heated to a temperature of from 200° C. to about 250° C. The heated reactor is then evacuated to less than 6.65 kPa (50 m torr), and then filled with hydrogen at 275.6 kPa (40 psia) initial pressure. The pressure drops as hydrogen is consumed in the process of converting the oxides into water vapor. After constant pressure is achieved the reactor is again evacuated to less than 6,65 kPa (50 m torr) and hydrogen is reintroduced to 137.8 kPa (20 psia). This procedure is repeated until there is no longer any evidence of hydrogen consumption, i.e. no decrease in initial hydrogen pressure. It usually takes two cycles for a 20 g to 25 g batch of copper dust. The reactor is then cooled to room temperature and the copper is removed.

2. The Substrate

The sheets of substrate are cut into the circuit board size. The boards are washed with a mild detergent, rinsed with deionized water and dried in an oven for 2 hours at 150° C. Cleaned boards are kept in a dessicator until ready for use.

B. Electrolytic Copper Dust Spreading

In the preferred embodiments, an even layer of powder must be spread on the substrate to create a uniform compact. To accomplish this, the copper is spread across the top of a plastic screen having a thickness of 0.0457 cm, a mesh width of 0.0254 cm and a mesh of 0.033 cm, which contacts the surface of the plastic substrate, filling in the screen opening. After application of the first layer, a second finer vibrating plastics screen having a mesh thickness of 0.0127 cm, mesh width of 0.0229 cm and a mesh of 0.0127 cm, is then brought into contact with the copper dust. This spreads the powder out resulting in a smooth layer.

C. Compaction

A model 2518 Carver Laboratory Press (Fred S. Carver Company, Monomonee Falls, Wis.) with motorization package is used for compaction. The platens are capable of being heated or cooled independently of each other. The die is affixed to the top platen and heated. Cooling water flows through the bottom platen to keep its temperature below 25° C. A mold release agent is applied to the tool to prevent the electrolytic copper dust from sticking to it.

The copper coated substrate is placed on the bottom platen in alignment with the patterned tool. The press is closed rapidly and brought to full compaction force. Full compaction forced is maintained for a period of time sufficient to compact the dust to the extent desired. The pressure is then reduced to the lower embedding pressure and held there for a period of time sufficient to embed the conductor in the substrate to the desired depth.

D. Cleaning

Once the board is removed from the press, the excess, uncompacted copper is brushed off and recovered. The screens used for spreading the copper puts approximately 2 g on the board of which approximately 0.15 g remains as the compacted conductor.

Process parameters and physical parameters of the resulting circuit board set forth in the following Table I. In Table I, the following abbreviations have the following meanings.

(a) "PEI" is polyetherimide manufactured and sold by General Electric Corporation under the tradename Ultem 1000.

(b) "PS" is polysulfone manufactured and sold by Union Carbide Corporation under the tradename Udel.

(c) "PET" is polyethylene terephthalate containing 30% glass manufactured and sold by Allied Corporation under the tradename PETRA 130 FR.

(d) "—" indicates that no evaluation was made.

(e) "PEIG" is polyetherimide containing 20% glass manufactured and sold by General Electric Corp. under the tradename, Ultem 2200.

(f) "PES" is polyethersulfone manufactured and sold by ICI Corp. under the tradename, Victrex.

TABLE I

| Ex. No. | Substrate | Temp. Top Platen °C. | Temp. Bottom Platen °C. | Compaction Force kPa × $10^5$ | Compaction Time Secs. | Embedding Force kPa × $10^5$ | Embedding Time Secs. |
|---|---|---|---|---|---|---|---|
| 1 | PES | 254 | 20 | 82.7 | — | — | — |
| 2 | PES | 254 | 20 | 82.7 | 2 | — | — |
| 3 | PES | 254 | 20 | 103.4 | 1 | — | — |
| 4 | PS | 210 | 20 | 137.4 | — | 20.7 | 15 |
| 5 | PS | 214 | 25 | 103.4 | — | 20.7 | 10 |
| 6 | PS | 210 | 27 | 82.7 | — | 20.7 | 15 |
| 7 | PS | 214 | 40 | 68.9 | — | 13.8 | 15 |
| 8 | PET | 185 | 20 | 68.9 | — | 13.8 | 3 |
| 9 | PET | 185 | 17 | 68.9 | — | 10.3 | 7 |
| 10 | PET | 215 | 20 | 68.9 | — | 10.3 | 5 |
| 11 | PET | 193 | 40 | 68.9 | — | 10.3 | 15 |
| 12 | PET | 200 | 20 | 103.4 | — | 20.7 | 15 |
| 13 | PEI | 252 | 20 | 137.4 | — | 20.7 | 15 |
| 14 | PEI | 253 | 20 | 137.4 | — | 20.7 | 15 |
| 15 | PEI | 253 | 20 | 137.4 | — | 20.7 | 15 |
| 16 | PEI | 253 | 20 | 137.4 | — | 20.7 | 15 |
| 17 | PEI | 253 | 20 | 137.4 | — | 20.7 | 15 |
| 18 | PEI | 253 | 20 | 137.4 | — | 20.7 | 15 |
| 19 | PEI | 254 | 20 | 137.4 | — | 20.7 | 15 |
| 20 | PEI | 254 | 20 | 137.4 | — | 20.7 | 15 |
| 21 | PEI | 254 | 20 | 137.4 | — | 20.7 | 15 |
| 22 | PEI | 253 | 20 | 137.4 | — | 20.7 | 15 |
| 23 | PEI | 253 | 20 | 137.4 | — | 20.7 | 15 |
| 24 | PEI | 257 | 20 | 137.4 | — | 20.7 | 15 |
| 25 | PEI | 257 | 20 | 137.4 | — | 20.7 | 15 |
| 26 | PEI | 257 | 20 | 137.4 | — | 20.7 | 15 |
| 27 | PEI | 257 | 20 | 137.4 | — | 20.7 | 15 |
| 28 | PEI | 257 | 20 | 137.4 | — | 20.7 | 15 |
| 29 | PEI | 257 | 20 | 137.4 | — | 20.7 | 15 |
| 30 | PEI | 253 | 20 | 137.4 | — | 20.7 | 15 |
| 31 | PEI | 253 | 20 | 137.4 | — | 20.7 | 15 |
| 32 | PEI | 253 | 20 | 137.4 | — | 20.7 | 15 |
| 33 | PEI | 252 | 20 | 137.4 | — | 20.7 | 15 |
| 34 | PEI | 253 | 20 | 137.4 | — | 20.7 | 15 |
| 35 | PEI | 253 | 20 | 137.4 | — | 20.7 | 15 |
| 36 | PEI | 253 | 20 | 137.4 | — | 20.7 | 15 |
| 37 | PEI | 255 | 52 | 137.4 | — | 20.7 | 15 |
| 38 | PEI | 244 | 54 | 137.4 | — | 20.7 | 15 |
| 39 | PEI | 238 | 54 | 137.4 | — | 20.7 | 15 |
| 40 | PEI | 256 | 56 | 137.4 | — | 20.7 | 15 |
| 41 | PEI | 261 | 55 | 137.4 | — | 20.7 | 15 |
| 42 | PEIG | 260 | 40 | 137.4 | — | 20.7 | 15 |
| 43 | PEIG | 275 | 15 | 137.4 | — | 20.7 | 10 |
| 44 | PEIG | 280 | 5 | 137.4 | — | 20.7 | 3 |
| 45 | PEIG | 250 | 40 | 137.4 | — | 20.7 | 15 |

EXAMPLE 46

The sample of Examples 1 to 45 were evaluated as follows:

1. Conductivity Measurements

Resistivity of each sample was measured by the "4 point method". In this method, the sample is placed in a jig especially made for the sample. The jig connected as the resistor in a circuit and the voltage drop is measured at a current of 0.1 amps. The conductivity of the sample is calculated using standard procedures and the result expressed as $$\% \, IACS = \frac{\text{conductivity of sample}}{\text{conductivity of pure copper}} \times 100.$$

2. Circuit Adhesion

Circuit adhesion was measured by grasping the edge of the circuit and measuring the force required to detach the circuit from the substrate.

The results of these evaluations are set forth in the following Table II.

TABLE II

| Sample by Examples | Substrate | Conductivity Range % IACS | Average Adhesion Kg Force |
|---|---|---|---|
| 1 to 3 | Polyethersulfone | 40 | 3.6 |
| 4 to 7 | Polysulfone | 35–40 | 3.1 |
| 8 to 12 | Polyethylene terephthalate 30% glass | 40–50 | 2.7 |
| 13 to 40 | Polyetherimide | 45–55 | 4.1 |
| 41 to 44 | Polyetherimide 20% glass | 45–55 | 5.9 |

What is claimed is:

1. A method of placing electrically conductive paths on a heat softenable substrate comprising the steps of:
   (a) applying a layer of a composition comprising finely divided metal particles to all or a portion of a heat softenable substrate;
   (b) compacting said metal particles in a pre-determined circuit pattern by applying a die heated to a temperature less than the melting point of said metal to said metal particles at a pressure and for a time sufficient to compact said particles, said die having the desired circuit pattern thereon and projecting from the surface thereof and acting to compact the metal particles in the areas contacted by the circuit defining portions of said die; and
   (c) embedding said compacted metal particles into said surface of said substrate by continuing the application of said heated die to said compacted metal particles for a time sufficient to embed said compacted particles in said substrate.

2. A method according to claim 1 wherein the surfaces of said particles are substantially free of metal oxides.

3. A method according to claim 1 wherein said metal is tin, copper, iron, platinum, aluminum, silver, gold, nickel, palladium or alloys thereof.

4. A method according to claim 3 wherein said metal is copper.

5. A method according to claim 4 wherein said copper is electrolytic dust.

6. A method according to claim 3 wherein said metal is tin.

7. A method according to claim 1 wherein said particles are flaky and irregularly shaped having an averge diameter of less than about 75 micrometers.

8. A method according to claim 7 wherein said diameter is less than about 50 micrometers.

9. A method according the claim 8 wherein said diameter is less than about 35 micrometers.

10. A method according to claim 1 wherein said substrate is a thermoplastic polymeric material.

11. A method according to claim 8 wherein said thermoplastic polymeric material is glass filled.

12. A method according to claim 11 wherein said substrate is composed of a material selected from the group consisting of polyetherimides, polyethersulfones, polysulfones, polyethylene terephthalate, and polyphenylene sulfides.

13. A method according to claim 12 wherein said substrate is composed of polyetherimides and polyethylene terephthalates.

14. A method according to claim 11 wherein said substrate is composed of a polyetherimide.

15. A method according to claim 1 wherein in step (b) said heated die is applied to said metal powder at a temperature of from about 25° C. to about 300° C., and a pressure of from about 34,470 kPa to about 379,170 kPa for a period of from about 1 sec to about 3600 secs.

16. A method according to claim 15 wherein said temperature is from about 100° C. to about 280° C., said pressure is from about 68,940 kPa to about 275,760 kPa, and said period is from about 1 to about 60 secs.

17. A method according to claim 16 wherein said temperature is from about 180° C. to about 265° C., said pressure is from about 103,410 kPa to about 241,290 kPa and said period is from about 1 to about 30 secs.

18. A method according to claim 1 wherein said metal particles are compacted in step (b) to an average thickness of at least about 0.005 mm and a conductivity of at least about 5% IACS.

19. A method according to claim 18 wherein said average thickness is from about 0.025 to about 0.30 mm and said conductivity is at least about 20% IACS.

20. A method according to claim 19 wherein said average thickness is from about 0.05 to about 0.20 mm and said conductivity is at least about 30% IACS.

21. A method according to claim 20 wherein said average thickness is from about 0.05 to about 0.10 mm and said conductivity is at least about 40% IACS.

22. A method according to claim 1 wherein in step (c) said heated die is applied to said compacted particles at a temperature of from about 25° C. to about 300° C. and at a pressure of from about 6,894 kPa to about 344,700 kPa for a time period of from about 1 to about 3600 seconds.

23. A method according to claim 22 wherein said temperature is from about 180° C. to about 280° C., said pressure is from about 3,447 kPa to about 68,940 kPa and said period is from about 1 to about 60 sec.

24. A method according to claim 23 wherein said temperature is from about 200° C. to about 265° C., said pressure from about 6,894 kPa to about 34,470 kPa and said period from about 1 to about 30 seconds.

25. A method according to claim 24 wherein said temperature is from about 245° C. to about 260° C., said pressure from about 10,341 kPa to about 24,129 kPa and said pressure is from about 5 seconds to about 20 seconds.

26. A method according to claim 1 wherein said compacted metal particles are embedded in said substrate to depth of at least about 75 micrometers.

27. A method according to claim 26 wherein said depth is from about 25 micrometers to about 250 micrometers.

28. A method according to claim 27 wherein said depth is from about 125 to about 200 micrometers.

29. A printed circuit board manufactured in accordance with the method of claim 1.

30. A method according to claim 1 wherein the temperature of said die is less than about the fusion temperature of said metal.

31. A method according to claim 30 wherein said temperature is more than about 100° C. less than the fusion temperature of said metal.

32. A method according to claim 30 wherein said temperature is equal to or greater than about the isothermal annealing temperature of said metal and less than about said fusion temperature.

33. A method according to claim 1 wherein said substrate is cooled during said compacting and embedding step.

34. A method of placing electrically conductive paths on a heat softenable substrate comprising the steps of:
(a) applying a layer of a composition consisting essentially of finely divided flaky metal particles to all or a portion of a heat softenable substrate, the surface of said particles being substantially free of metal oxides; and
(b) compacting said metal particles in a predetermined circuit pattern by applying to said particles a die having a temperature less than the fusion temperature of said metal at a pressure and for a time sufficient to compact said particles, said die having the desired circuit pattern thereon, and projecting from the surface thereof, and acting to compact the metal particles in the areas contacted by the circuit pattern and embedding said compacted particles into said heat softenable substrate.

35. A method according to claim 34 wherein said substrate is cooled during said compaction and embedding step.

36. A printed circuit board prepared in accordance with the method of claim 1.

* * * * *